US011004885B2

(12) United States Patent
Seko

(10) Patent No.: US 11,004,885 B2
(45) Date of Patent: May 11, 2021

(54) SOLID-STATE IMAGE CAPTURE ELEMENT AND ELECTRONIC DEVICE ENABLED TO ELIMINATE ASYMMETRY OF A LIGHT RECEPTION AMOUNT

(71) Applicant: SONY SEMICONDUCTOR SOLUTIONS CORPORATION, Kanagawa (JP)

(72) Inventor: Hiroaki Seko, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 76 days.

(21) Appl. No.: 15/562,758

(22) PCT Filed: Mar. 24, 2016

(86) PCT No.: PCT/JP2016/059323
§ 371 (c)(1),
(2) Date: Sep. 28, 2017

(87) PCT Pub. No.: WO2016/163242
PCT Pub. Date: Oct. 13, 2016

(65) Prior Publication Data
US 2018/0083059 A1 Mar. 22, 2018

(30) Foreign Application Priority Data

Apr. 7, 2015 (JP) .............................. JP2015-078600

(51) Int. Cl.
H01L 27/146 (2006.01)
H04N 5/369 (2011.01)
H04N 9/04 (2006.01)

(52) U.S. Cl.
CPC .... H01L 27/14636 (2013.01); H01L 27/1464 (2013.01); H01L 27/14623 (2013.01);
(Continued)

(58) Field of Classification Search
CPC ......... H01L 27/14636; H01L 27/14629; H01L 27/14623; H01L 27/1464; H01L 27/14625;
(Continued)

(56) References Cited

U.S. PATENT DOCUMENTS

2010/0203665 A1* 8/2010 Park .................. H01L 27/14627
438/70
2011/0140225 A1* 6/2011 Tsutsui .............. H01L 27/14623
257/440

(Continued)

FOREIGN PATENT DOCUMENTS

CN 103811508 5/2014
JP 2013-55159 A 3/2013

(Continued)

OTHER PUBLICATIONS

International Search Report prepared by the Japan Patent Office dated May 13, 2016, for International Application No. PCT/JP2016/059323.

(Continued)

Primary Examiner — Jennifer D Bennett
(74) Attorney, Agent, or Firm — Sheridan Ross P.C.

(57) ABSTRACT

The present disclosure relates to a solid-state image capture element and an electronic device which are enabled to eliminate asymmetry of a light reception amount in accordance with an incident angle of light incident on a pixel. A solid-state image capture element includes: a pixel including a light-receiving portion that receives light incident from a rear-surface side of a semiconductor substrate; and a wiring layer laminated on a front-surface of the semiconductor substrate. The pixel includes a symmetrical wiring that is formed symmetrically with respect to a center of the pixel in a plane view of the pixel. The symmetrical wiring is arranged in a layer closest to the light-receiving portion, of (Continued)

a plurality of layers of wiring formed in the wiring layer. For example, the present technology can be applied to a rear-surface irradiation type solid-state image capture element.

20 Claims, 14 Drawing Sheets

(52) U.S. Cl.
CPC .. *H01L 27/14625* (2013.01); *H01L 27/14629* (2013.01); *H04N 5/369* (2013.01); *H04N 9/04557* (2018.08); *H01L 27/14621* (2013.01); *H01L 27/14645* (2013.01)

(58) Field of Classification Search
CPC ......... H01L 27/14645; H01L 27/14621; H01L 23/552; H04N 5/369; H04N 9/04557
See application file for complete search history.

(56) References Cited

U.S. PATENT DOCUMENTS

| | | | |
|---|---|---|---|
| 2011/0266421 A1* | 11/2011 | Nozaki | H01L 27/1464 250/216 |
| 2013/0200251 A1* | 8/2013 | Velichko | H01L 31/02327 250/208.1 |
| 2014/0111663 A1* | 4/2014 | Soda | H01L 27/1464 348/222.1 |
| 2014/0117481 A1 | 5/2014 | Kato et al. | |
| 2014/0132812 A1 | 5/2014 | Soda | |
| 2014/0145287 A1 | 5/2014 | Kato | |

FOREIGN PATENT DOCUMENTS

| | | |
|---|---|---|
| JP | 2014-86699 A | 5/2014 |
| JP | 2014-96540 A | 5/2014 |

OTHER PUBLICATIONS

Official Action (with English translation) for China Patent Application No. 201680017826.6, dated Jan. 6, 2021, 15 pages.

* cited by examiner

FIG. 4

| INCIDENT ANGLE | ENTIRE SURFACE | 300nm SHRINK | 600nm SHRINK | 900nm SHRINK |
|---|---|---|---|---|
| 0 | 0.68% | 0.41% | 0.24% | -1.60% |
| 10 | 2.08% | 2.13% | 4.99% | 4.34% |
| 20 | 15.96% | 11.01% | 12.31% | 7.47% |
| | Gb B / R Gr | | | |

SOLID-STATE IMAGE CAPTURE ELEMENT AND ELECTRONIC DEVICE ENABLED TO ELIMINATE ASYMMETRY OF A LIGHT RECEPTION AMOUNT

CROSS REFERENCE TO RELATED APPLICATIONS

This application is a national stage application under 35 U.S.C. 371 and claims the benefit of PCT Application No. PCT/JP2016/059323 having an international filing date of 24 Mar. 2016, which designated the United States, which PCT application claimed the benefit of Japanese Patent Application No. 2015-078600 filed 7 Apr. 2015, the disclosures of which are incorporated herein by reference in their entirety.

TECHNICAL FIELD

The present disclosure relates to a solid-state image capture element and an electronic device, and particularly, relates to a solid-state image capture element and an electronic device which are enabled to eliminate asymmetry of a light reception amount in accordance with an incident angle of light incident on a pixel.

BACKGROUND ART

Conventionally, in an electronic device with an imaging function, such as a digital still camera or a digital video camera, for example, a solid-state image capture element, such as a charge coupled device (CCD) or a complementary metal oxide semiconductor (CMOS) image sensor is used. The solid-state image capture element has a pixel in which a photodiode that performs photoelectric conversion and a plurality of transistors are combined, and an image is constructed on the basis of pixel signals output from a plurality of pixels arranged in an image plane on which an image of a subject is formed.

Moreover, in recent years, a rear-surface irradiation type solid-state image capture element is often used in which a semiconductor substrate with a photodiode formed thereon is thinned, wiring layers are laminated on the front-surface of the semiconductor substrate, and light is incident from the rear-surface side of the semiconductor substrate to the photodiode.

By the way, in the rear-surface irradiation type solid-state image capture element, light incident from the rear-surface side passes through the semiconductor substrate and is reflected by a wiring formed in the wiring layer, and the reflected light may enter the photodiode. In this case, when the wiring formed in the wiring layer is asymmetrically formed with respect to the center of a pixel, a light amount of the reflected light incident on the photodiode may vary in accordance with an incident angle of the light. That is, in this case, even if a certain amount of light is incident on a pixel while the incident angle of the light is changed, an amount of the reflected light incident on the photodiode varies due to the asymmetry of the wiring layout, and thus a light reception amount of a pixel may not be constant.

Moreover, Patent Literature 1 discloses a rear-surface irradiation type solid-state image capture element which employs such a wiring layout that a wiring is not arranged under the pixels for receiving long wavelength light that easily passes through a semiconductor substrate, and suppresses mixing of light by reducing light reflection in the wiring layer.

CITATION LIST

Patent Literature

Patent Literature 1: JP2011-129627A

DISCLOSURE OF INVENTION

Technical Problem

By the way, in recent years, along with increase of speed of reading pixel signals from pixels, signal lines and control lines tend to increase, and thus it becomes difficult to employ such a wiring layout that wiring is not arranged under the pixels, like the aforementioned Patent Literature 1. Moreover, because such a wiring layout has lower flexibility of design, it is desired to enhance the flexibility of design and maintain a light reception amount of pixel constant with respect to an incident angle of light.

The present disclosure is devised in consideration of the situations, and it is possible to eliminate asymmetry of a light reception amount in accordance with an incident angle of light incident on the pixels.

Solution to Problem

A solid-state image capture element of an aspect of the present disclosure includes: a pixel including a light-receiving portion that receives light incident from a rear-surface side of a semiconductor substrate; and a wiring layer laminated on a front-surface of the semiconductor substrate. The pixel includes a symmetrical wiring that is formed symmetrically with respect to a center of the pixel in a plane view of the pixel.

An electronic device of an aspect of the present disclosure includes a solid-state image capture element including a pixel including a light-receiving portion that receives light incident from a rear-surface side of a semiconductor substrate, and a wiring layer laminated on a front-surface of the semiconductor substrate. The pixel includes a symmetrical wiring that is formed symmetrically with respect to a center of the pixel in a plane view of the pixel.

In an aspect of the present disclosure, a pixel including a light-receiving portion that receives light incident from a rear-surface side of a semiconductor substrate, and a wiring layer laminated on a front-surface of the semiconductor substrate are included. In the pixel, a symmetrical wiring is formed symmetrically with respect to a center of the pixel in a plane view of the pixel.

Advantageous Effects of Invention

According to an aspect of the present disclosure, asymmetry of a light reception amount in accordance with an incident angle of light incident on pixels can be eliminated.

BRIEF DESCRIPTION OF DRAWINGS

FIG. 4 is a diagram showing a relationship between a space of wiring and mixing of light.

MODE(S) FOR CARRYING OUT THE INVENTION

Hereinbelow, a specific description is given of specific embodiments to which the present technology is applied with reference to the drawings.

Figure 1:
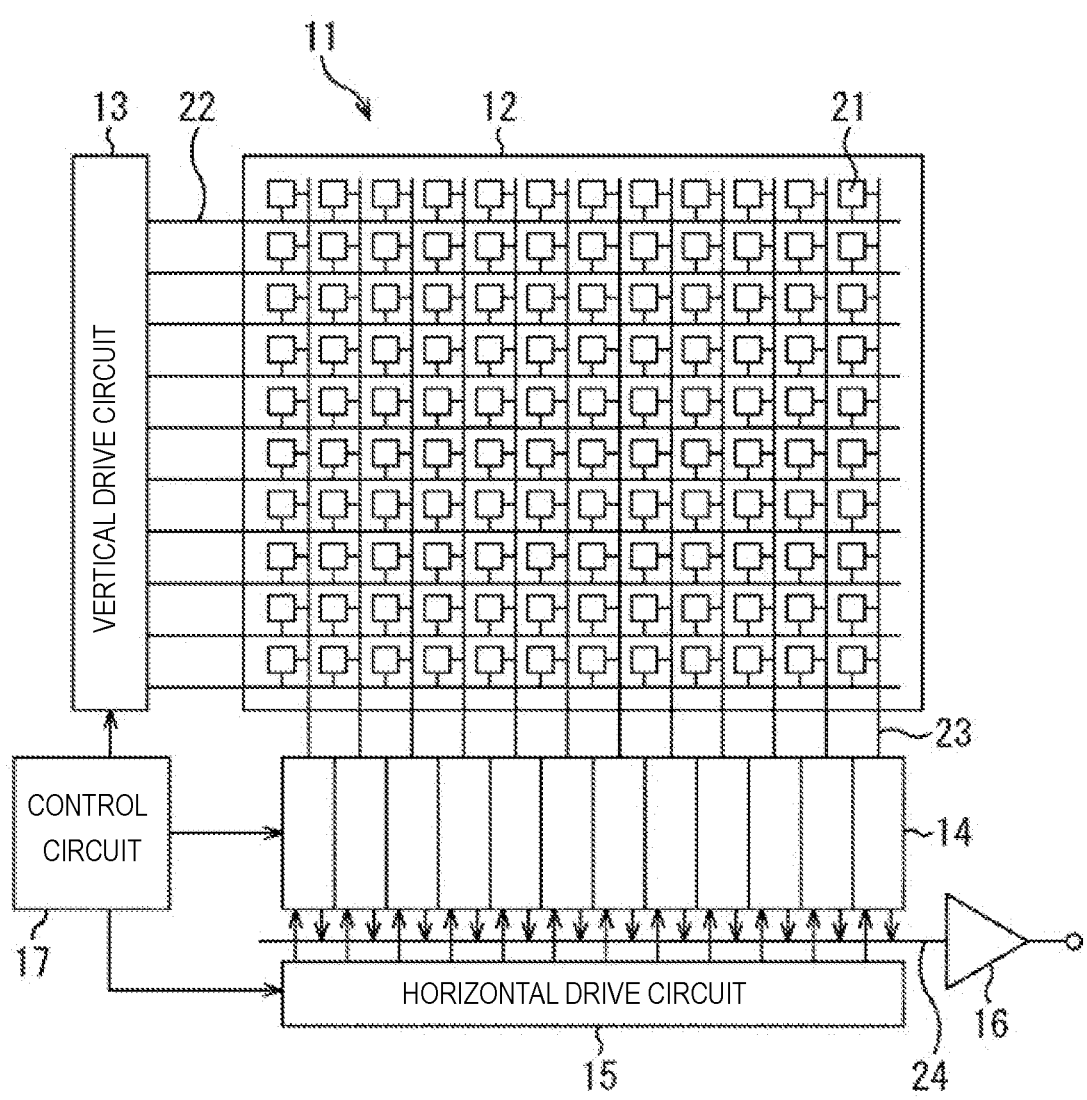
FIG. 1 is a block diagram showing a configuration example of an embodiment of an image capture element to which the present technology is applied.

FIG. 1 is a block diagram showing a configuration example of an embodiment of an image capture element to which the present technology is applied.

As shown in FIG. 1, an image capture element 11 includes a pixel region 12, a vertical drive circuit 13, a column signal processing circuit 14, a horizontal drive circuit 15, an output circuit 16, and a control circuit 17.

The pixel region 12 is a light receiving surface that receives light collected by an optical system (not shown). In the pixel region 12, a plurality of pixels 21 is arranged in a matrix, and each pixel 21 is connected to the vertical drive circuit 13 via a horizontal signal line 22 for each row and to the column signal processing circuit 14 via a vertical signal line 23 for each column. The plurality of pixels 21 outputs pixel signals at levels in accordance with the amount of light received, respectively, and images of the subject formed in the pixel region 12 are constructed from the pixel signals.

The vertical drive circuit 13 sequentially supplies a drive signal for driving (transferring, selecting, resetting, etc.) each pixel 21 to the pixel 21 via the horizontal signal line 22, for each row of the plurality of pixels 21 arranged in the pixel region 12. The column signal processing circuit 14 performs correlated double sampling (CDS) processing on pixel signals output from the plurality of pixels 21 via the vertical signal lines 23, and thereby performs AD conversion of the pixel signals and removes the reset noise.

The horizontal drive circuit 15 sequentially supplies drive signals for outputting pixel signals from the column signal processing circuit 14 to a data output signal line 24, to the column signal processing circuit 14, for each column of the plurality of pixels 21 arranged in the pixel region 12. The output circuit 16 amplifies the pixel signal supplied from the column signal processing circuit 14 via the data output signal line 24 at timing according to the drive signals of the horizontal drive circuit 15, and outputs the amplified pixel signal to a signal processing circuit in a later stage. The control circuit 17 generates and supplies, for example, a clock signal according to the drive period of each block of the image capture element 11 and thereby controls the drive of each block.

In the image capture element 11 thus configured, for example, color filters which transmit red light, green light, and blue light are arranged for each pixel 21 according to so-called Bayer array, and each pixel 21 outputs a pixel signal in accordance with the amount of light of each color. Moreover, the image capture element 11 can employ a rear-surface type structure in which the semiconductor substrate with photodiodes configuring the pixels 21 formed thereon is thinned, wiring layers are laminated on the front-surface of the semiconductor substrate, and light is incident from the rear-surface side of the semiconductor substrate.

A configuration of the pixels 21 will be described with reference to FIG. 2.

Figure 2:
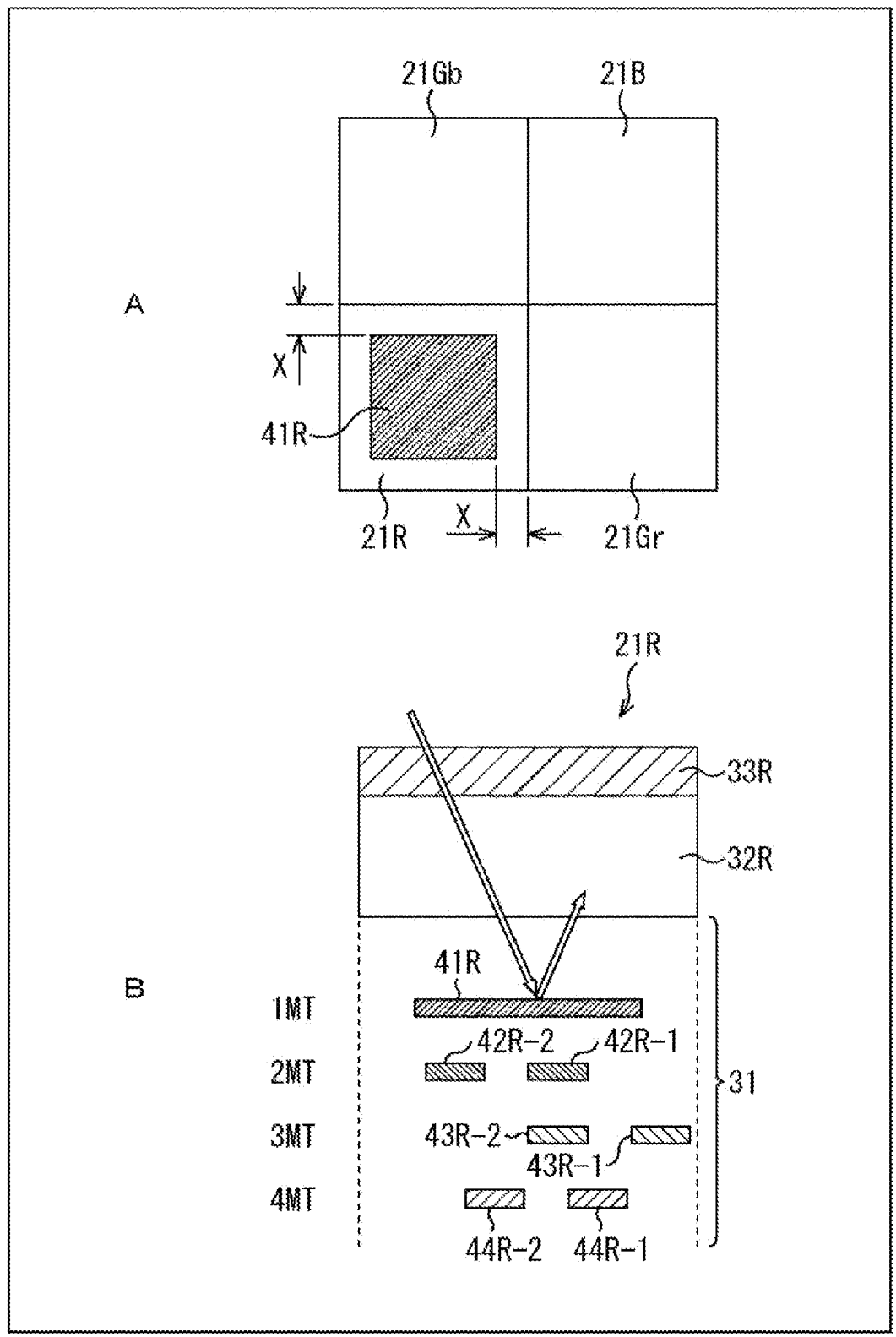
FIG. 2 is a diagram showing a configuration example of pixels.

A of FIG. 2 shows a planar configuration example of four pixels 21 (pixel 21R, pixel 21Gr, pixel 21Gb, and pixel 21B) arranged in 2×2 according to the Bayer array, and B of FIG. 2 shows a cross-sectional configuration example of the pixel 21R.

As shown in A of FIG. 2, in the Bayer array, the pixel 21R for receiving red light and the pixel 21B for receiving blue light are arranged in rows and columns different from each other. Then, the pixel 21Gr for receiving green light is arranged alternately with the pixel 21R in the row of the pixel 21R, and the pixel 21Gb for receiving green light is arranged alternately with the pixel 21B in the row of the pixel 21B. Accordingly, as shown, the pixel 21R, the pixel 21Gr arranged on the right side of the pixel 21R, the pixel 21Gb arranged on the upper side of the pixel 21R, and the pixel 21B arranged diagonally with respect to the pixel 21R are used as one set.

As shown in B of FIG. 2, the pixel 21R is formed by lamination of a wiring layer 31, a light-receiving portion 32R, and a red filter 33R in order from the bottom.

The wiring layer 31 is formed by lamination of a plurality of wirings insulated by interlayer insulating films, and in an example of FIG. 2, the wiring layer 31 is formed by lamination of four layers of wirings 41R to 44R. In other words, in the wiring layer 31, a wiring 41R that is a first layer (1MT), wirings 42R-1 and 42R-2 that are second layers (2MT), wirings 43R-1 and 43R-2 that are third layers (3MT), wirings 44R-1 and 44R-2 that are fourth layers (4MT) are formed in order from the light-receiving portion 32R side.

The light-receiving portion 32R is a photodiode formed by P-N junction of a P-type region and an N-type region formed on a semiconductor substrate, receives red light that passes through the red filter 33R, generates electric charges in accordance with the amount of light and holds the electric charges.

The red filter 33R is a color filter that transmits red light and is arranged at a position corresponding to the pixel 21R. Note that, although not shown, a color filter that transmits blue light is arranged in the pixel 21B, and color filters that transmit green light are arranged in the pixels 21Gr and 21Gb.

Further, in the pixel 21R, the wiring 41R formed closest to the light-receiving portion 32R is formed in a square that is symmetrical with respect to the center (shape or optical center) of the pixel 21R and is arranged at the center of the pixel 21R, when the pixel 21R is viewed in a planar view. Thus, in the pixel 21R, the wiring 41R can conceal asymmetry of the wirings 42R to 44R formed in the second and lower layers of the wiring layer 31 (on the farther side from the light-receiving portion 32R), and a shading shape of the wiring 41R can be improved.

For example, particularly in the rear-surface type image capture element 11, longer wavelength light easily passes through a semiconductor substrate, and thereby in the pixel 21R, light that has passed through the light-receiving portion 32R is reflected on the wirings 41R to 44R of the wiring layer 31, and the reflected light may enter the light-receiving portion 32R. Therefore, when the wirings 41R to 44R are not formed symmetrically with respect to the pixel 21R, due to the asymmetry, an amount of the reflected light incident on the light-receiving portion 32R may vary depending on an incident angle of the light.

Improvement of asymmetry of a light reception amount of the light-receiving portion 32R in accordance with an incident angle of light incident on the pixel 21R will be described with reference to FIG. 3.

Figure 3:
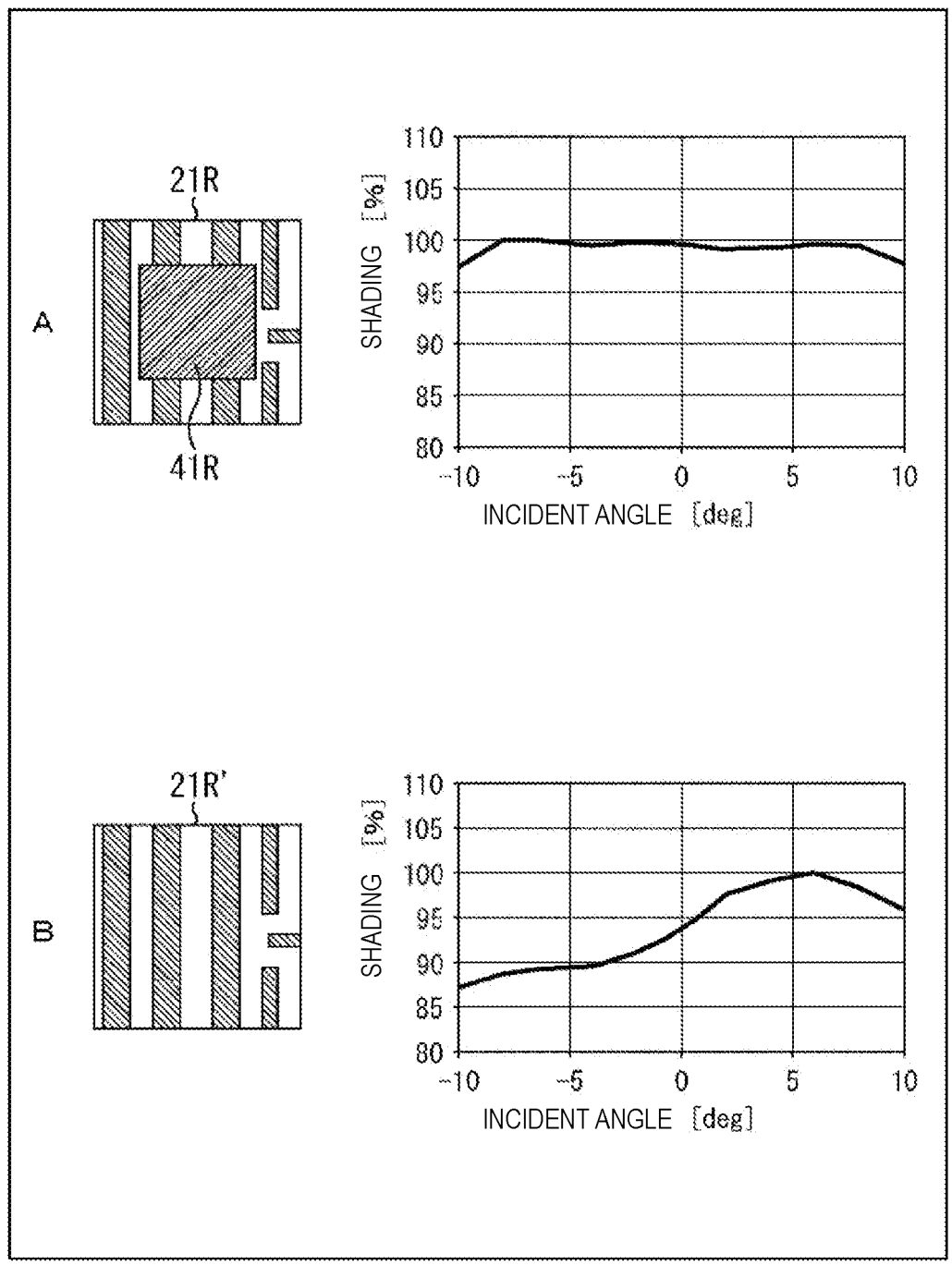
FIG. 3 is a diagram showing improvement of shading shape.

A of FIG. 3 shows a simulation result of the pixel 21R in which the wiring 41R of a symmetrical shape is provided, and B of FIG. 2 shows a simulation result of a pixel 21R' in which the wiring 41R of a symmetrical shape is not provided.

In the pixel 21R, the wiring 41R as described above with reference to FIG. 2 is formed in a first layer of the wiring layer 31, and the wirings 42R to 44R are asymmetrically formed in second and lower layers of the wiring layer 31. On the other hand, in the pixel 21W, the wirings 42R to 44R are formed asymmetrically in the second and lower layers of the wiring layer 31. In other words, the simulation is conducted such that the pixel 21R and pixel 21W are configured to differ only in the presence or absence of the wiring 41R and have the same wirings 42R to 44R in the second and lower layers of the wiring layer 31.

Moreover, in the simulation result shown in the right side of A of FIG. 3 and B of FIG. 3, the horizontal axis represents an incident angle (an angle when an angle orthogonal to the front-surface is 0 degree) of light incident on the pixel 21R and pixel 21R'. Moreover, the vertical axis represents the ratio of a pixel signal (hereinbelow, referred to as "shading") for each incident angle to the maximum value with the maximum value taken as 100%.

As shown in A of FIG. 3, in the pixel 21R, shading with respect to an incident angle of light is substantially constant, and it is indicated that no great change (very small change) occurs in a pixel signal output from the pixel 21R regardless of the incident angle of light incident on the pixel 21R.

In contrast, as shown in B of FIG. 3, in the pixel 21R', shading with respect to an incident angle of light is not constant, and the waveform (hereinbelow, referred to as "shading shape") is asymmetric. That is, it is indicated that, in accordance with an incident angle of light incident on the pixel 21R', a great change occurs in a pixel signal output from the pixel 21R'. As described above, in the pixel 21R', when an incident angle of incident light changes, due to the asymmetry of the wirings 42R to 44R, an amount of light received by the pixel 21R' changes, in other words, the shading shape deteriorates (the difference of reflected light between the plus side and the minus side of incident angle increases).

Accordingly, the pixel 21R is provided centrally with the wiring 41R of a symmetrical shape, and thereby removing adverse effects caused by asymmetry of the wirings 42R to 44R formed in the second and lower layers of the wiring layer 31, and improving the shading shape compared with the pixel 21R'.

Here, as shown in A of FIG. 2, in the pixel 21R, the wiring 41R is formed to have spaces X between the wiring 41R and the adjacent pixels 21Gr and 21Gb, respectively. Providing such a space X enables to avoid light incident on the pixel 21R from being reflected on the wiring 41R and mixing into the pixel 21Gr or 21Gb.

For example, the configuration is employed in which the wiring 41R is formed to cover the entire surface of the first layer of the wiring layer 31 (all regions excluding portions where through-electrodes are formed), so that it is contemplated that adverse effects caused by asymmetry of the wirings 42R to 44R formed in the second and lower layers can be avoided. However, when the wiring 41R is formed to cover the entire surface, it is apprehended that the light reflected on the wiring 41R mixes into the adjacent pixel 21Gr or 21Gb.

Here, a relationship between the spaces X provided between the wiring 41R and the pixels 21Gr and 21Gb and the mixing of light from the pixel 21R to the pixel 21Gr or 21Gb will be described with reference to FIG. 4.

FIG. 4 shows simulation results of an output ratio (GR/GB) which is a ratio of a pixel signal GR output from the pixel 21Gr with respect to a pixel signal GB output from the pixel 21Gb, when an incident angle of light is changed to the row direction of the pixel 21R.

For example, when the space X of the wiring 41R is set to 0 nm, in other words, when the wiring 41R is formed on the entire surface of the first layer of the wiring layer 31, an output ratio when an incident angle is 0 degree (orthogonal to the sensor surface) is 0.68%. Moreover, an output ratio when an incident angle is 10 degrees is 2.08%, and an output ratio when an incident angle is 20 degrees is 15.96%. In other words, it is indicated that as an incident angle of light is increased to the row direction of the pixel 21R, the mixing into the pixel 21Gr adjacent in the row direction is increased in a larger degree than the mixing into the pixel 21Gb adjacent in the column direction.

Moreover, when the space X of the wiring 41R is set to 300 nm, an output ratio when an incident angle is 0 degree is 0.41%, an output ratio when an incident angle is 10 degrees is 2.13%, and an output ratio when incident angle is 20 degrees is 11.01%. Further, when the space X of the wiring 41R is set to 600 nm, an output ratio when an incident angle is 0 degree is 0.24%, an output ratio when an incident angle is 10 degrees is 4.99%, and an output ratio when an incident angle is 20 degrees is 12.31%. Furthermore, when the space X of the wiring 41R is set to 900 nm, an output ratio when an incident angle is 0 degree is −1.60%, an output ratio when an incident angle is 10 degrees is 4.34%, and an output ratio when an incident angle is 20 degrees is 7.47%.

As described above, the pixel 21R having a configuration in which the wiring 41R is formed to have the spaces X between the wiring 41R and the pixels 21Gr and 21Gb, respectively can suppress the mixing of light into the pixels 21Gr and 21Gb, compared with a configuration in which the wiring 41R is formed on the entire surface of the first layer of the wiring layer 31. Particularly in the case that an incident angle is large, the mixing of light is greatly increased when the wiring 41R is formed on the entire surface of the first layer of the wiring layer 31, while the mixing of light can be effectively suppressed when the space X is provided.

Accordingly, in order to suppress the mixing of light as described above, in the pixel 21R, it is necessary to layout the wiring 41R by providing an appropriate space X.

By the way, when the wiring 41R is formed with the space X in the pixel 21R, it is apprehended that the light which passes through the gap is reflected on a wiring under the wiring 41R, and the reflected light mixes into the adjacent pixel 21Gr or 21Gb. Accordingly, it is possible to provide a wiring for shielding such light in the first layer of the wiring layer 31 of the pixel 21Gr or 21Gb. Note that, hereinbelow, when the pixels 21Gr and 21Gb need not to be distinguished, they are simply referred to as "pixel 21G" as appropriate.

A wiring 41G for shielding light provided in the pixel 21G will be described with reference to FIG. 5.

Figure 5:
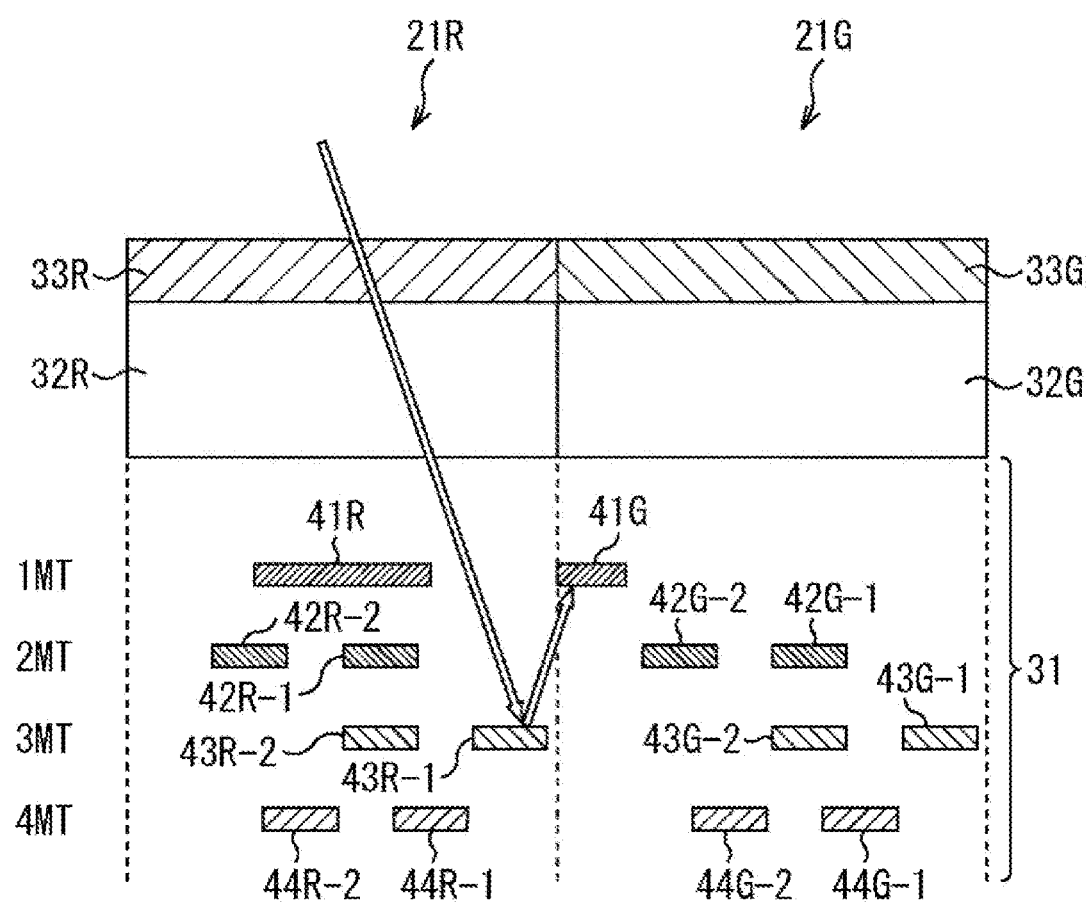
FIG. 5 is an explanatory diagram of a light shielding wiring.

FIG. 5 shows a cross-sectional configuration example of the pixel 21R and pixel 21G. As shown in FIG. 5, the pixel 21G is formed by lamination of a light-receiving portion 32G for receiving green light and a green filter 33G for transmitting green light on the wiring layer 31, as in the pixel 21R.

Further, in the pixel 21G, a wiring 41G formed to have a predetermined width from the boundary with the pixel 21R is provided in the first layer of the wiring layer 31. Accordingly, the pixel 21G can shield, with the wiring 41G, light reflected on wirings 42R to 44R of the second and lower layers provided in the wiring layer 31 of the pixel 21R, prevent such light from entering the light-receiving portion 32G, and reduce occurrence of color mixture.

As described above, in the image capture element 11, the pixel 21R can improve shading shape by having the wiring 41R formed symmetrically with respect to the center of pixel 21R, and the pixel 21G can prevent the mixing of light from the pixel 21R by having the wiring 41G for shielding light reflected on the wiring layer 31 of the pixel 21R.

Here, hereinbelow, the wiring 41R provided in the pixel 21R is also referred to as "symmetrical wiring 41R", and the wiring 41G provided in the pixel 21G is also referred to as "light shielding wiring 41G", as appropriate. For example, the symmetrical wiring 41R and the light shielding wiring 41G are connected to a drain power source VDD.

Furthermore, in the image capture element 11, in order to prevent the mixing of light from the pixel 21R to the pixel 21G, a distance between the symmetrical wiring 41R and the light shielding wiring 41G, and, a width of the light shielding wiring 41G preferably satisfy the conditions described below.

For example, in the pixel 21R, it is necessary to prevent the light reflected on the symmetrical wiring 41R from entering the light-receiving portion 32G.

A first condition that the distance between the symmetrical wiring 41R and the light shielding wiring 41G satisfies will be described with reference to FIG. 6.

Figure 6:
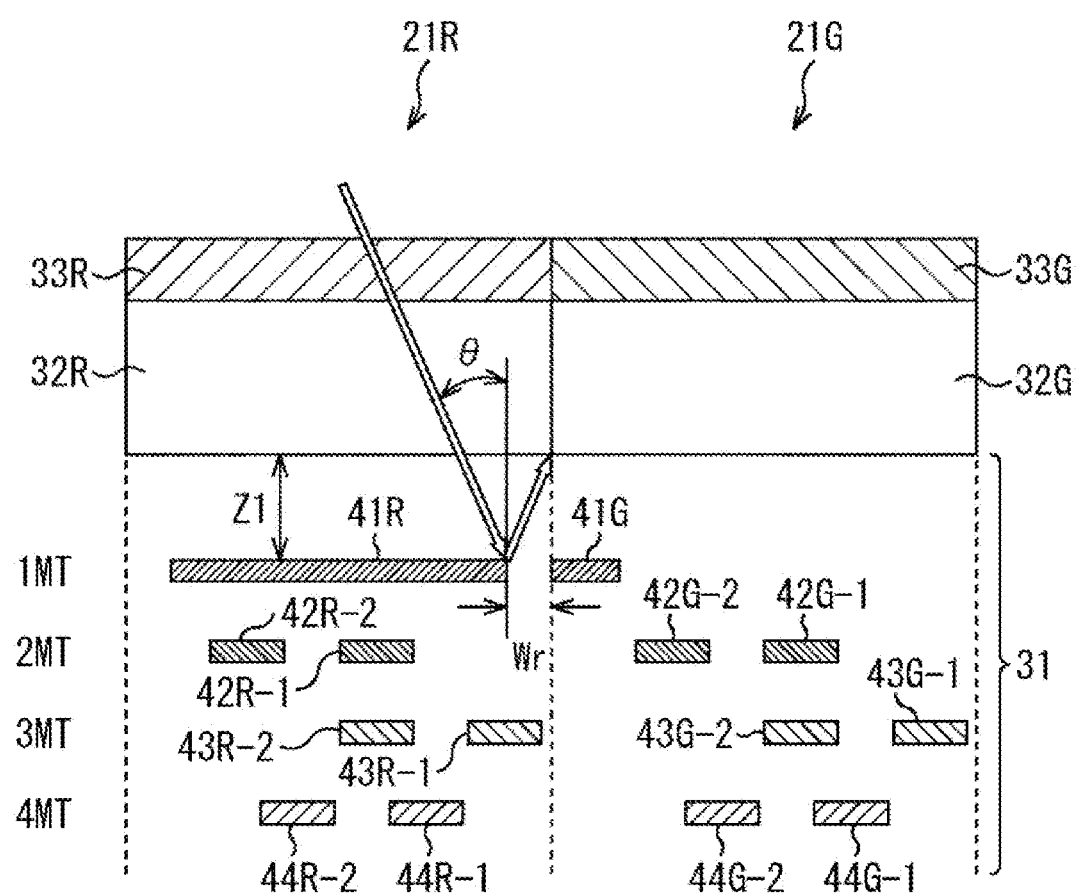
FIG. 6 is an explanatory diagram of a first condition which a distance between symmetrical wiring and the light shielding wiring satisfies.

For example, as shown by the void arrows in FIG. 6, in order to avoid light incident at an incident angle θ from being reflected at the end on the pixel 21G side of the wiring 41R and entering the light-receiving portion 32G, a distance Wr between the symmetrical wiring 41R and the light shielding wiring 41G is set. In other words, the distance Wr between the symmetrical wiring 41R and the light shielding wiring 41G needs to satisfy the relationship of Formula (1) as follows, with respect to a vertical distance Z1 between the light-receiving portion 32R and the symmetrical wiring 41R and an incident angle θ at which light enters the pixel 21R.

[Math. 1]

$$Wr > 2 \times Z1 \times \tan \theta \quad (1)$$

As described above, setting the distance Wr larger than the lower limit value (2×Z1×tan θ) shown in Formula (1) using the distance Z1 and the incident angle θ can avoid the light reflected on the symmetrical wiring 41R of the pixel 21R from entering the light-receiving portion 32G.

Next, in the pixel 21R, a wiring which is not covered by the symmetrical wiring 41R is provided in the second and lower layers of the wiring layer 31, it is necessary to prevent the light reflected on the wiring from passing between the symmetrical wiring 41R and the light shielding wiring 41G and entering the light-receiving portion 32G.

A second condition that a distance between the symmetrical wiring 41R and the light shielding wiring 41G satisfies will be described with reference to FIG. 7.

Figure 7:
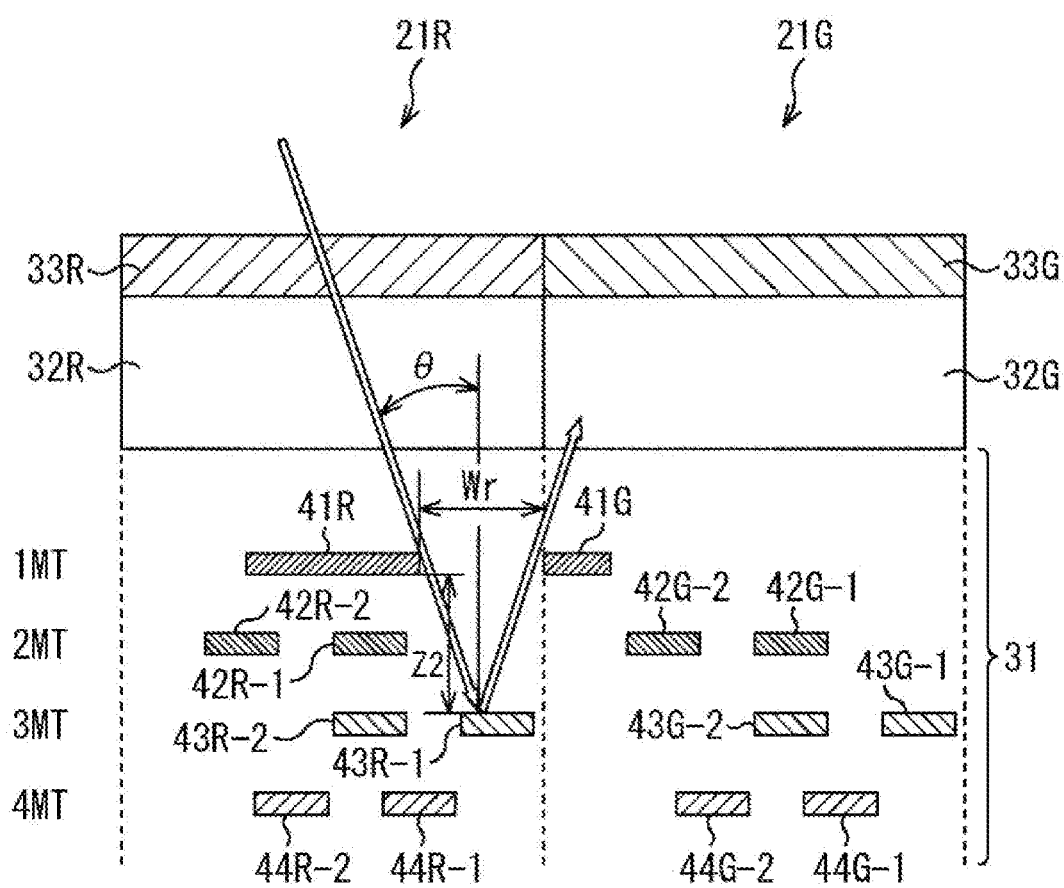
FIG. 7 is an explanatory diagram of a second condition which a distance between the symmetrical wiring and the light shielding wiring satisfies.

The pixel 21R shown in FIG. 7 has a configuration in which the wiring 43R-1 which is not covered by the symmetrical wiring 41R is provided. Then, for example, as shown by the void arrows in FIG. 7, it is necessary to prevent light incident at an incident angle θ from passing the gap between the symmetrical wiring 41R and the light shielding wiring 41G and being reflected on the wiring 43R-1, and the reflected light from passing through the gap and entering the light-receiving portion 32G.

To this end, the distance Wr between the symmetrical wiring 41R and the light shielding wiring 41G needs to satisfy the relationship of Formula (2) as follows, with respect to the vertical distance Z2 between the symmetrical wiring 41R and the wiring 43R-1, and an incident angle θ at which light enters the pixel 21R.

[Math. 2]

$$Wr < 2 \times Z2 \times \tan \theta \quad (2)$$

As described above, setting the distance Wr smaller than the upper limit value (2×Z2×tan θ) shown in Formula (2) using the distance Z2 and the incident angle θ can avoid light reflected on the wiring 43R-1 which is not covered by the symmetrical wiring 41R of the pixel 21R from entering the light-receiving portion 32G.

Next, in the pixel 21R, when a wiring which is not covered by the symmetrical wiring 41R is provided in the second and lower layers of the wiring layer 31, it is necessary to prevent the light reflected on the wiring from passing through the inner side of the pixel 21G than the light shielding wiring 41G and entering the light-receiving portion 32G.

Conditions which a width of the light shielding wiring 41G satisfies will be described with reference to FIG. 8.

Figure 8:
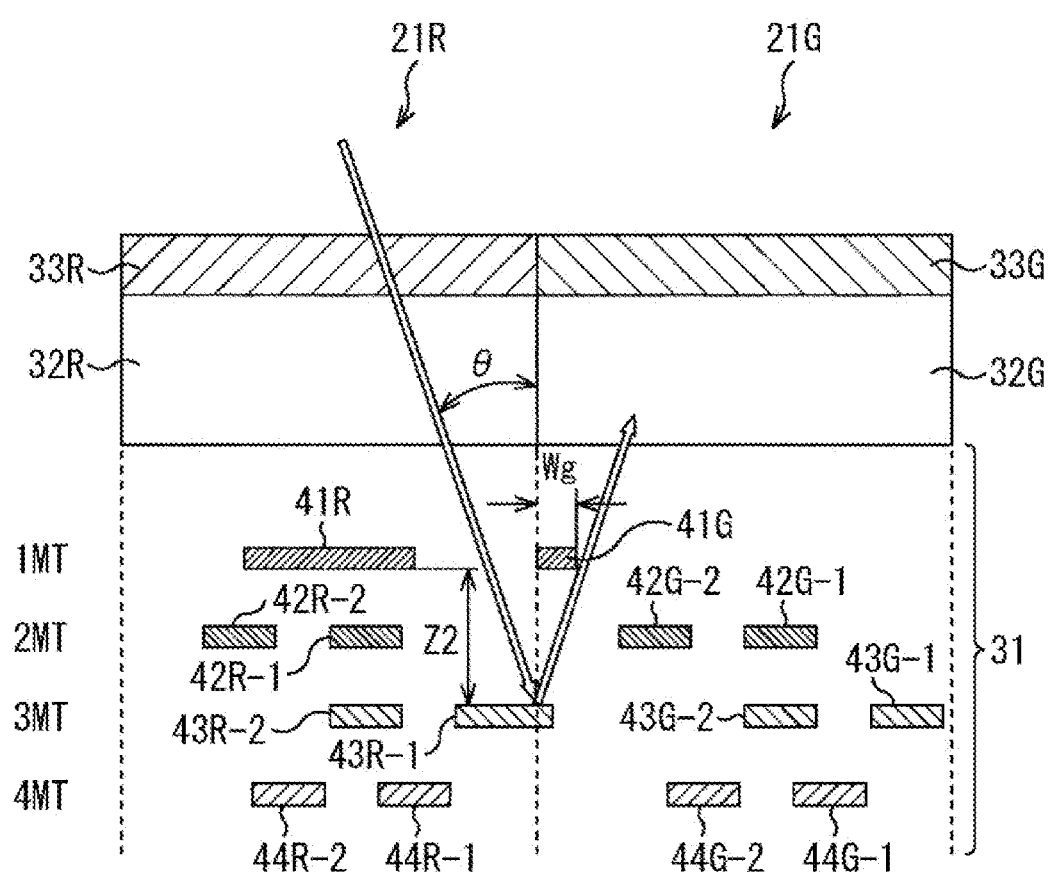
FIG. 8 is an explanatory diagram of a condition which a width of the light shielding wiring satisfies.

The pixel 21R shown in FIG. 8 has a configuration in which the wiring 43R-1 not covered by the symmetrical wiring 41R is provided. Then, for example, as shown by the void arrows in FIG. 8, it is necessary to prevent the light incident at an incident angle θ from passing through a gap between the symmetrical wiring 41R and the light shielding wiring 41G and being reflected on the wiring 43R-1, and the reflected light from passing through the inner side of the pixel 21G than the light shielding wiring 41G and entering the light-receiving portion 32G.

To this end, a width Wg of the light shielding wiring 41G needs to satisfy the relationship of Formula (3) as follows with respect to a vertical distance Z2 between the symmetrical wiring 41R and the wiring 43R-1 and an incident angle θ at which light enters the pixel 21R.

[Math. 3]

$$Wg > Z2 \times \tan \theta \quad (3)$$

As described above, setting the width Wg larger than the lower limit value (Z2×tan θ) shown in Formula (3) using the distance Z2 and the incident angle θ can avoid the light reflected on the wiring 43R-1 which is not covered by the symmetrical wiring 41R of the pixel 21R from entering the light-receiving portion 32G.

As described above, the image capture element 11 can eliminate asymmetry of a light reception amount in accordance with an incident angle of light incident on the pixel 21R. Particularly in the pixel 21R, the wirings 42R to 44R formed in the second and lower layers of the wiring layer 31 may be formed asymmetrically, and flexibility of design of wiring layout can be enhanced. For example, in the image capture element 11, it is possible to increase speed of reading pixel signals by increasing signal lines, control lines and the like.

By the way, in the image capture element 11, an incident angle θ of light incident on the pixel 21 varies depending on a position where the pixel 21 is arranged in the pixel region 12. In other words, the incident angle θ decreases at the center of the pixel region 12, and the incident angle θ increases in the periphery of the pixel region 12. Accordingly, in the image capture element 11, it is preferable to correct the distance Wr and the width Wg in accordance with the position of the pixel 21 (hereinbelow, referred to as "pupil correction").

Next, the pupil correction of the distance Wr and the width Wg in accordance with a position where the pixel 21 is arranged will be described with reference to FIGS. 9 and 10.

Figure 9:
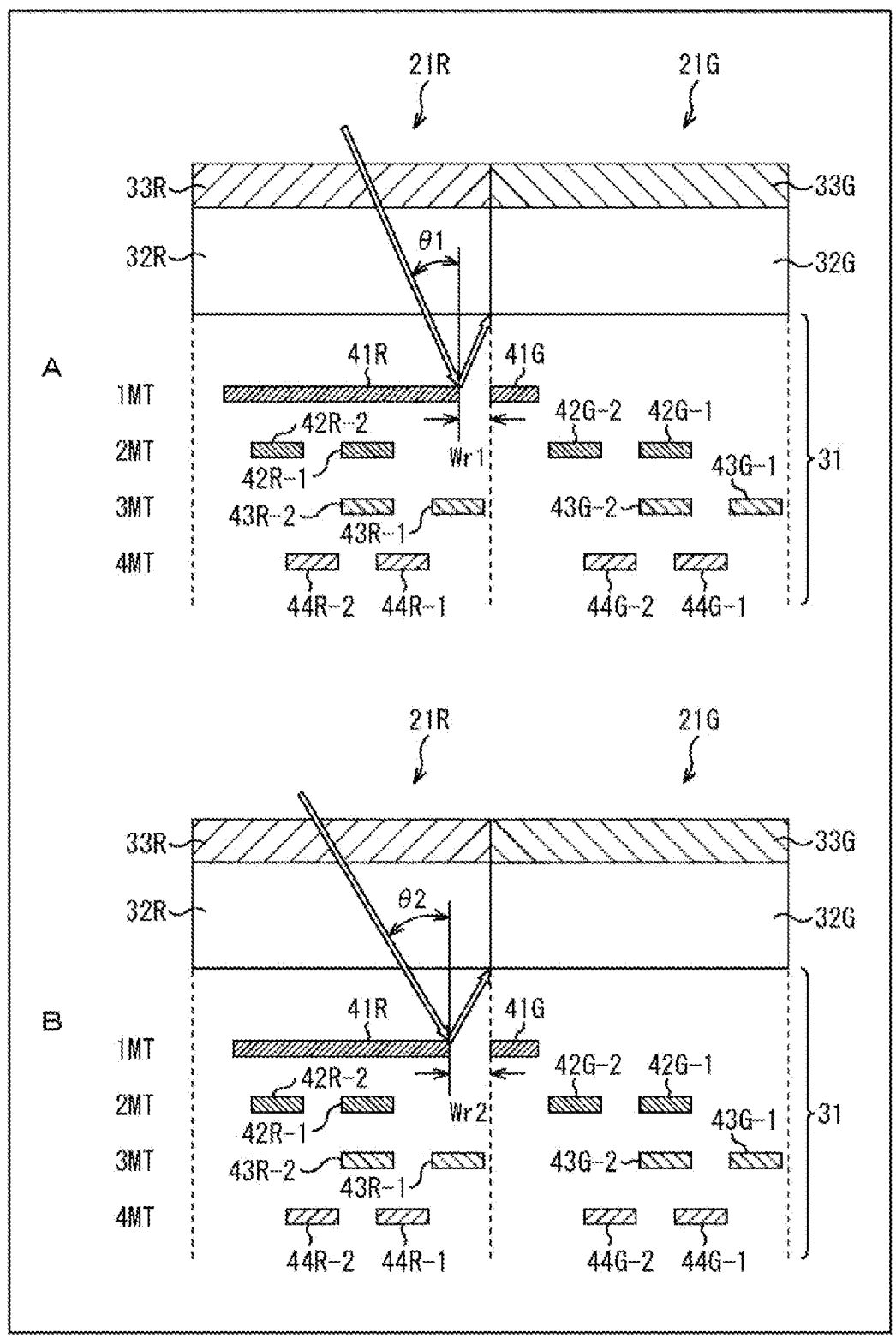
FIG. 9 is an explanatory diagram of pupil correction.

A of FIG. 9 shows a cross-sectional configuration example of the pixel 21R and the pixel 21G arranged at the center of the pixel region 12, and B of FIG. 9 shows a cross-sectional configuration example of the pixel 21R and the pixel 21G arranged in the periphery of the pixel region 12.

As shown in FIG. 9, the incident angle θ1 decreases at the center of the pixel region 12, and the incident angle θ2 increases in the periphery of the pixel region 12. Accordingly, it is preferable to perform pupil correction such that the distance Wr2 of the pixel 21R arranged in the periphery of the pixel region 12 is greater than the distance Wr1 of the pixel 21R arranged at the center of the pixel region 12 (Wr1<Wr2). Thus, the mixing of light from the pixel 21R to the pixel 21G can be appropriately reduced in accordance with the position where the pixel 21R and the pixel 21G are arranged in the pixel region 12.

Figure 10:
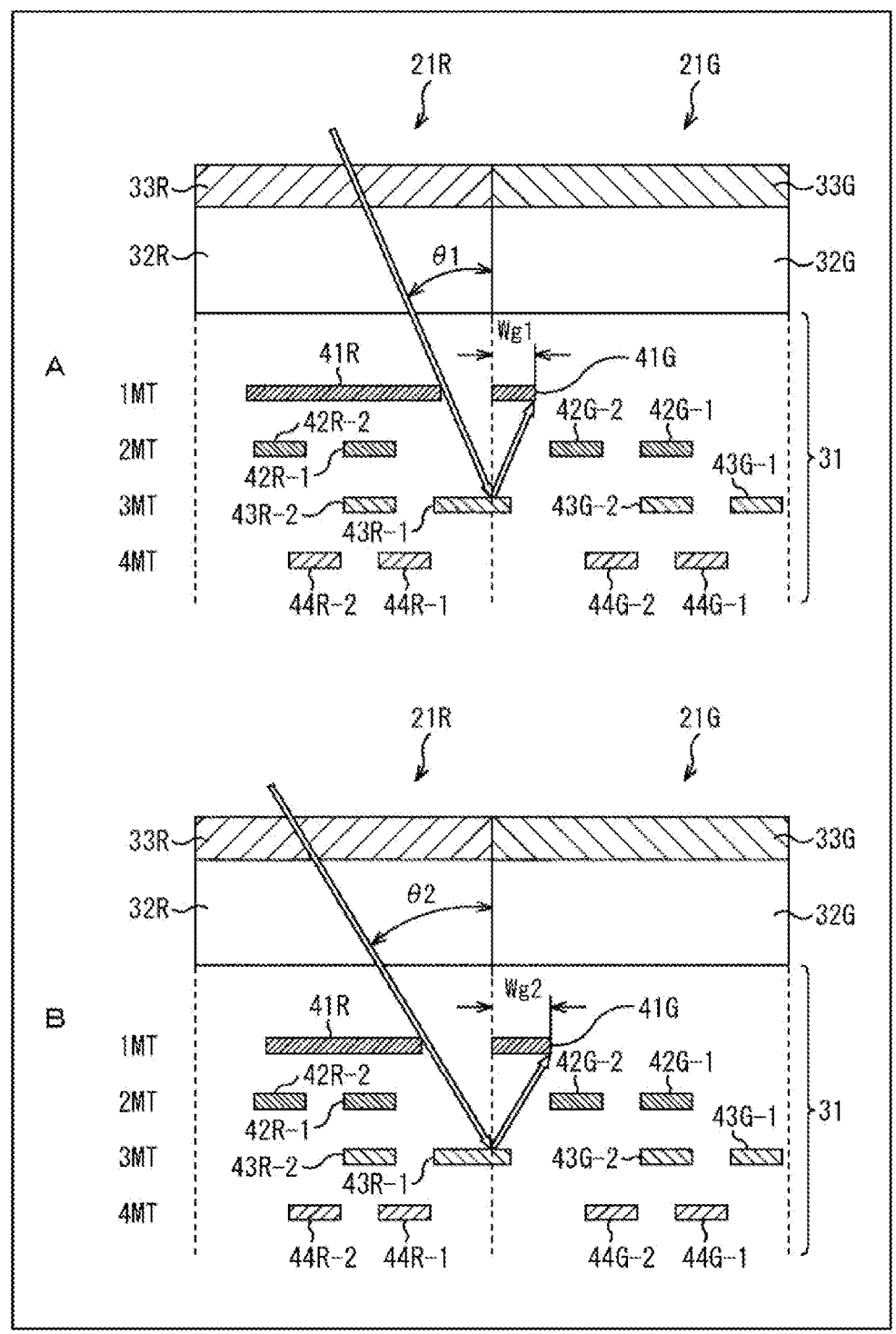
FIG. 10 is an explanatory diagram of pupil correction.

Moreover, A of FIG. 10 shows a cross-sectional configuration example of the pixel 21R and the pixel 21G arranged at the center of the pixel region 12, and B of FIG. 10 shows a cross-sectional configuration example of the pixel 21R and the pixel 21G arranged in the periphery of the pixel region 12.

As shown in FIG. 10, the incident angle θ1 decreases at the center of the pixel region 12, and the incident angle θ2 increases in the periphery of the pixel region 12. Accordingly, it is preferable to perform pupil correction such that the width Wg2 of the light shielding wiring 41G of the pixel 21G arranged in the periphery of pixel region 12 is greater than the width Wg1 of the light shielding wiring 41G of the pixel 21G arranged at the center of the pixel region 12 (Wg1<Wg2). Thus, the mixing of light from the pixel 21R to the pixel 21G can be appropriately reduced in accordance with the position where the pixel 21R and the pixel 21G are arranged in the pixel region 12.

By performing the pupil correction as described above, in the image capture element 11, it is possible to reduce color mixture regardless of an image height and capture an image in which noise due to color mixture is suppressed.

Note that, in the pixel 21R shown in FIG. 2, the planar shape of the wiring 41R formed in the first layer of the wiring layer 31 is formed in a square shape, but not limited thereto. Moreover, the wiring of a symmetrical shape may be formed in a layer other than the first layer of the wiring layer 31.

Next, modifications of the pixel 21R will be described with reference to FIGS. 11 to 13.

Figure 11:
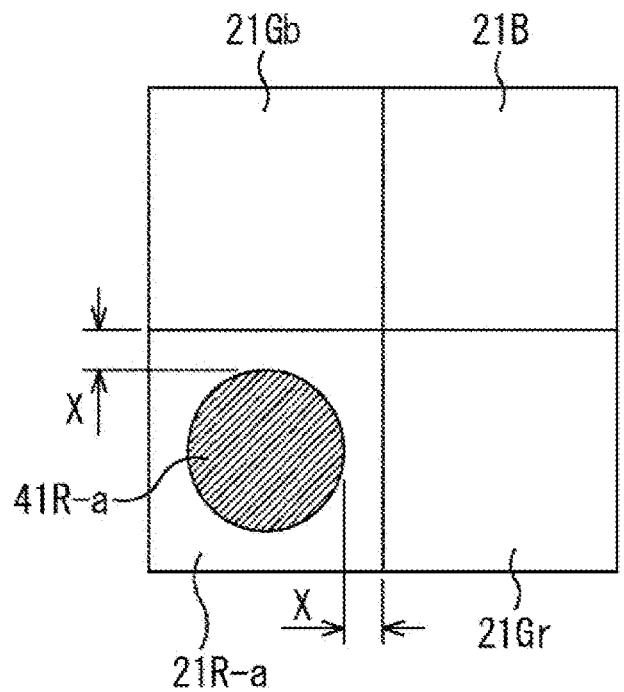
FIG. 11 is a diagram showing a first modification of a pixel.
Figure 12:
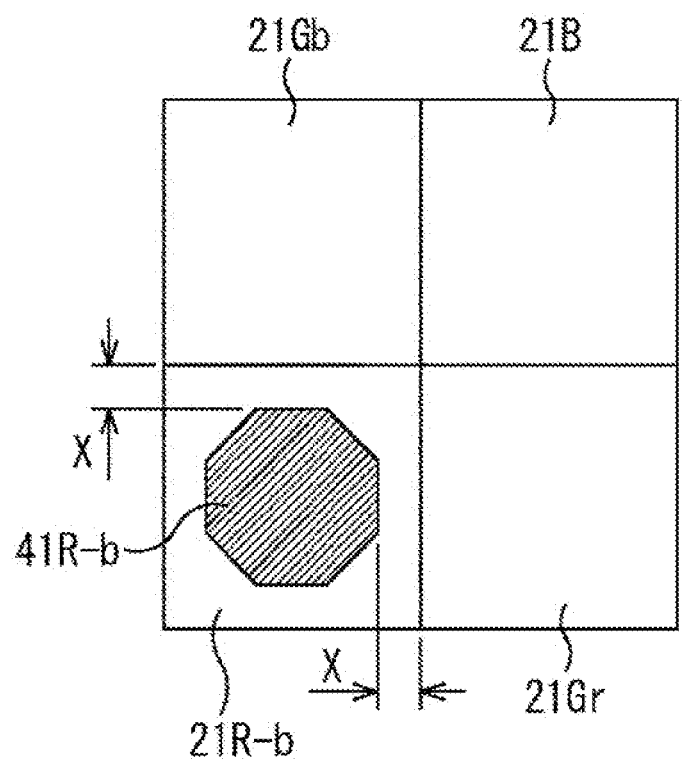
FIG. 12 is a diagram showing a second modification of a pixel.

For example, in the pixel 21R-a shown in FIG. 11, the planar shape of the wiring 41R-a formed in the first layer of the wiring layer 31 is formed in a circular shape. Moreover, in the pixel 21R-b shown in FIG. 12, the planar shape of the wiring 41R-b formed in the first layer of the wiring layer 31 is formed in an octagon shape. As described above, the planar shape of the wiring 41R may be any shape as long as it is symmetrical with respect to the center of the pixel 21R, and the wiring 41R need only conceal the asymmetry of the wiring of the second and lower layers and improve the shading shape.

Figure 13:
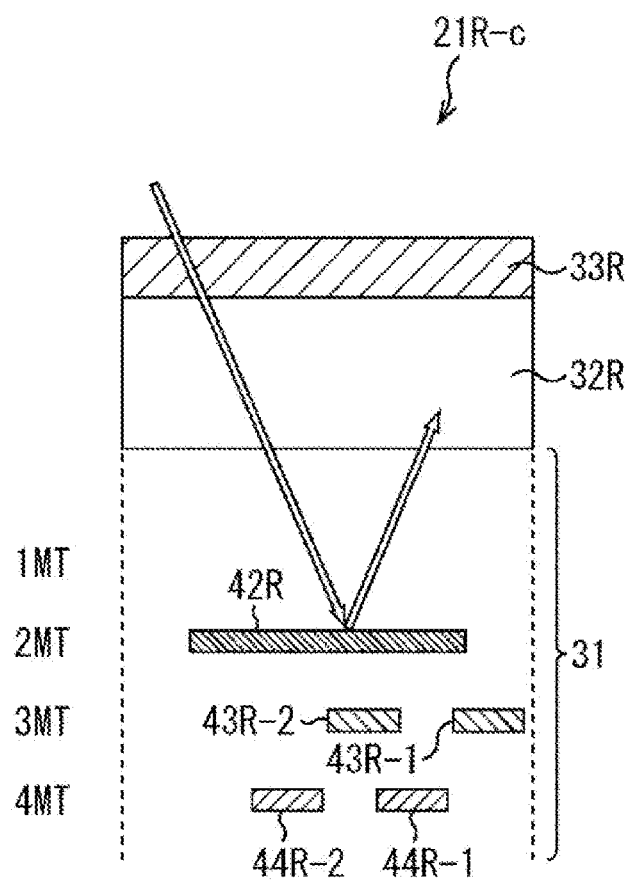
FIG. 13 is a diagram showing a third modification of a pixel.

Moreover, the pixel 21R-c shown in FIG. 13 has a configuration in which the wiring 42R with symmetry is formed in the second layer of the wiring layer 31. Note that, while the wiring 42R is formed in the second layer, in the pixel 21R-c, no wiring is formed in the first layer of the wiring layer 31, so that the wiring 42R is formed closest to the light-receiving portion 32R. As described above, when the wiring layer 31 has the degree of freedom of wiring layout, the wiring 42R with symmetry may be formed in the second layer of the wiring layer 31. The wiring 42R configured thus can suppress effects of the asymmetrical wiring 43R or 44R formed below the wiring 42R.

Moreover, for example, in the pixel 21R, the wiring 42R with symmetry is provided in the second layer of the wiring layer 31, and in the pixel 21G, the wiring 41G for shielding light is provided in the first layer of the wiring layer 31, so that it is possible to reliably prevent light reflected on the wiring 42R or light reflected on a wiring below the wiring 42R from entering the light-receiving portion 32G.

Note that, in the aforementioned present embodiment, while the configuration has been described in which the wiring 42R with symmetry formed in the first layer of the wiring layer 31 is provided in the pixel 21R, obviously, the wiring with symmetry formed in the first layer of the wiring layer 31 may be provided in the pixel 21B or the pixel 21G. As described above, the wiring 42R with symmetry formed in the first layer of the wiring layer 31 is not limited to being in the pixel 21R, and may be, for example, in the pixel 21 that receives infrared light. For example, a wiring with symmetry formed in the first layer of the wiring layer 31 is provided in the pixel 21 that receives light having a wavelength of 620 nm or more, thus giving a good effect.

Note that the image capture element 11 of the embodiment as described above can be used for various electronic devices, such as imaging systems, such as digital still cameras or digital video cameras, mobile phones having an imaging function, or other devices having an imaging function, for example.

Figure 14:
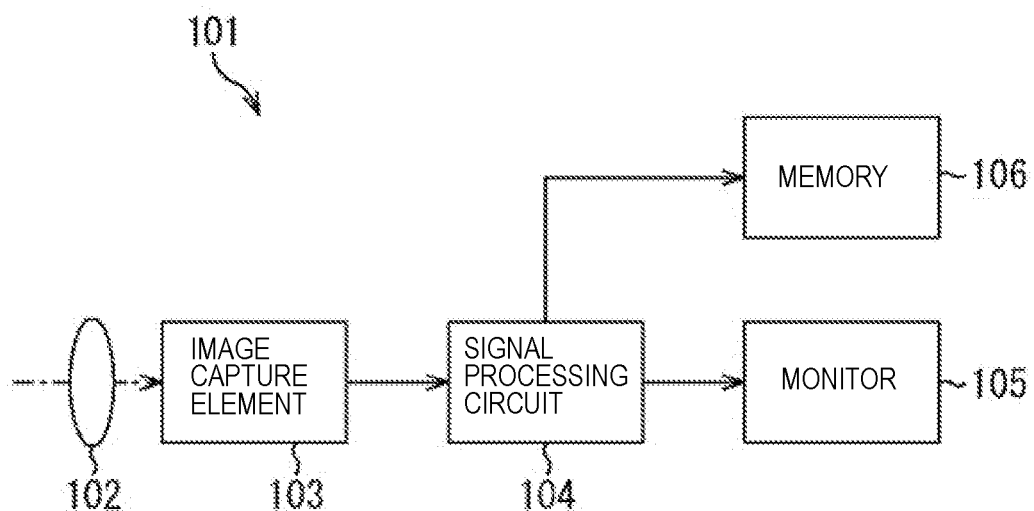
FIG. 14 is a block diagram showing a configuration example of an imaging device mounted on an electronic device.

FIG. 14 is a block diagram showing a configuration example of an imaging device mounted on an electronic device.

As shown in FIG. 14, an imaging device 101 includes an optical system 102, an image capture element 103, a signal processing circuit 104, a monitor 105, and a memory 106, and can capture still images and moving images.

The optical system 102 is configured to have one or a plurality of lenses, and guides image light from a subject (incident light) to the image capture element 103 and forms an image on the light receiving surface (sensor unit) of the image capture element 103.

As the image capture element 103, the image capture element 11 of the aforementioned embodiment is used. Electrons are stored in the image capture element 103 for a certain period in accordance with the image formed on the light receiving surface via the optical system 102. Then, a signal corresponding to electrons stored in the image capture element 103 is supplied to the signal processing circuit 104.

The signal processing circuit 104 performs various kinds of signal processing on the pixel signal output from the image capture element 103. The image (image data) obtained by the signal processing performed by the signal processing circuit 104 is supplied to and displayed on the monitor 105, or is supplied to and stored (recorded) in the memory 106.

In the imaging device 101 thus configured, for example, a high-quality image with adverse effects due to an incident angle of light removed can be captured by use of the image capture element 11 of the aforementioned embodiment.

Figure 15:
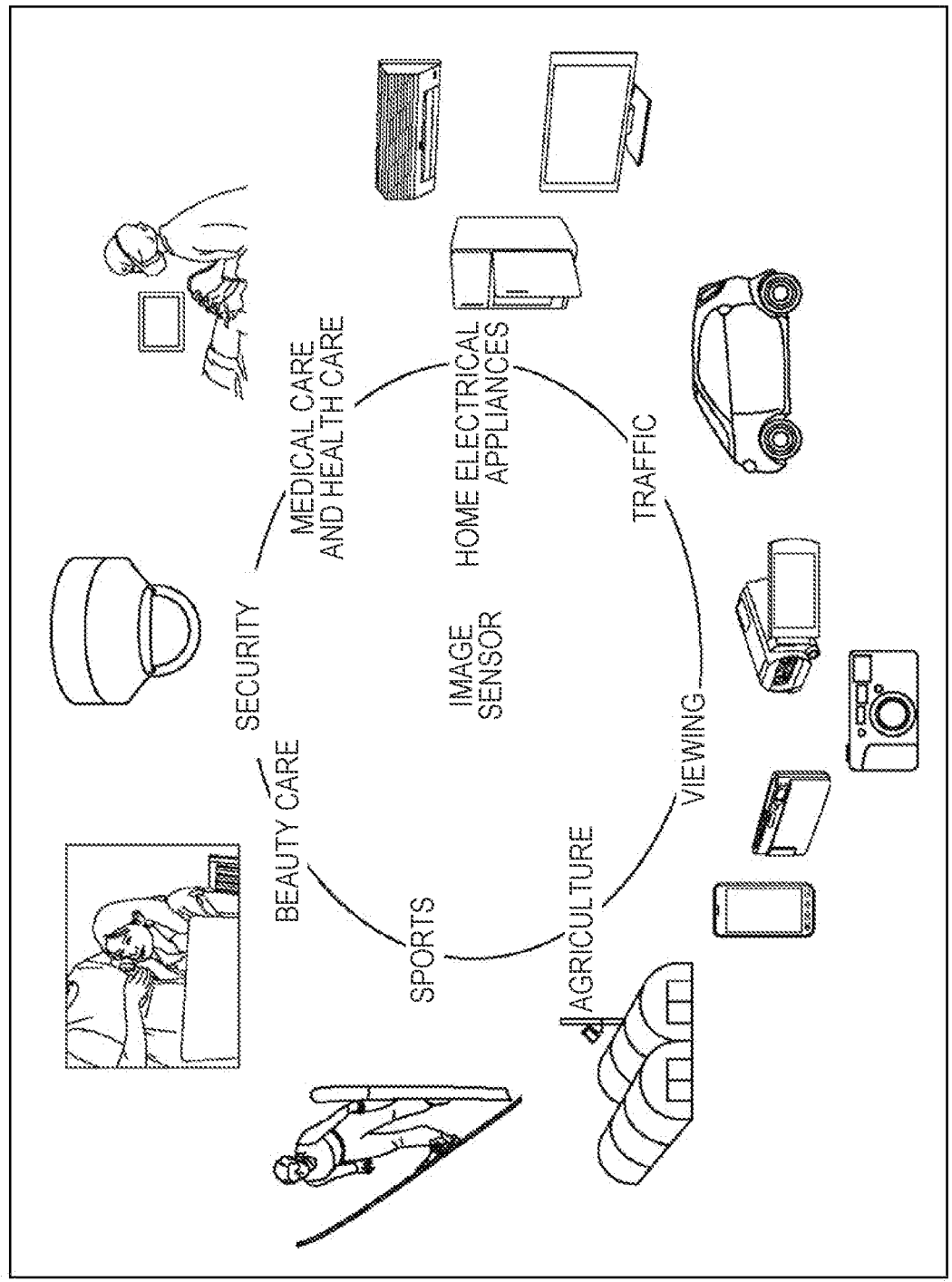
FIG. 15 is a diagram showing a usage example of using an image sensor.

FIG. 15 is a diagram showing a usage example of using the aforementioned image capture element 11 (image sensor).

The image sensor described above can be used in a variety of cases, e.g., sensing light such as visible light, infrared light, ultraviolet light, and X-ray.

- Devices that take images used for viewing, such as a digital camera and a portable appliance with a camera function.
- Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.
- Devices used for home electrical appliances, such as a TV, a refrigerator, and an air conditioner, to takes images of a gesture of a user and perform appliance operation in accordance with the gesture.
- Devices used for medical care and health care, such as an endoscope and a device that performs angiography by reception of infrared light.
- Devices used for security, such as a monitoring camera for crime prevention and a camera for personal authentication.
- Devices used for beauty care, such as skin measurement equipment that takes images of the skin and a microscope that takes images of the scalp.
- Devices used for sports, such as an action camera and a wearable camera for sports and the like.
- Devices used for agriculture, such as a camera for monitoring the condition of the field and crops.

Additionally, the present technology may also be configured as below.

(1)

A solid-state image capture element including:

a pixel including a light-receiving portion that receives light incident from a rear-surface side of a semiconductor substrate; and a wiring layer laminated on a front-surface of the semiconductor substrate, in which the pixel includes a symmetrical wiring that is formed symmetrically with respect to a center of the pixel in a plane view of the pixel.

(2)

The solid-state image capture element according to (1), in which the symmetrical wiring is arranged in a layer closest to the light-receiving portion, of a plurality of layers of wiring formed in the wiring layer.

(3)

The solid-state image capture element according to (1) or (2), in which a gap of a predetermined distance is provided between a second pixel adjacent to a first pixel including the symmetrical wiring and the symmetrical wiring.

(4)

The solid-state image capture element according to (3), in which a light shielding wiring having a predetermined width from a boundary of the first pixel is provided in a layer closest to the light-receiving portion, of a plurality of layers of wiring formed in the wiring layer of the second pixel.

(5)

The solid-state image capture element according to (3), in which in the first pixel, the predetermined distance provided between the second pixel and the symmetrical wiring is corrected in accordance with an arrangement position of the first pixel.

(6)

The solid-state image capture element according to (4), in which the predetermined width of the light shielding wiring provided in the second pixel is corrected in accordance with an arrangement position of the second pixel.

(7)

The solid-state image capture element according to any one of (1) to (6), in which the first pixel is a pixel configured to receive red light, and the second pixel is a pixel configured to receive green light.

(8)

The solid-state image capture element according to any one of (1) to (7), in which the first pixel is a pixel configured to receive light having a wavelength of 620 nm or more.

(9)

An electronic device including a solid-state image capture element including a pixel including a light-receiving portion that receives light incident from a rear-surface side of a semiconductor substrate, and a wiring layer laminated on a front-surface of the semiconductor substrate, in which the pixel includes a symmetrical wiring that is formed symmetrically with respect to a center of the pixel in a plane view of the pixel.

Note that, the present embodiment is not limited to the aforementioned embodiment and various changes can be made without departing from the gist of the present disclosure.

REFERENCE SIGNS LIST 11 image capture element
12 pixel region
13 vertical drive circuit
14 column signal processing circuit
15 horizontal drive circuit
16 output circuit
17 control circuit
21 pixel
22 horizontal signal line
23 vertical signal line 24 data output signal line
31 wiring layer
32R and 32G light-receiving portion
33R red filter
33G green filter
41 to 44 wiring

The invention claimed is:

1. A solid-state image capture element, comprising:
first and second pixels each including a light-receiving portion that receives light incident from a rear-surface side of a semiconductor substrate; and
a wiring layer laminated on a front-surface of the semiconductor substrate,
wherein the first pixel is adjacent to the second pixel,
wherein the first pixel includes a single symmetrical wiring that is formed symmetrically with respect to a center of the first pixel in a plane view of the first pixel in a layer closest to the light-receiving portion of a plurality of layers of wirings in the wiring layer,
wherein the second pixel includes a single asymmetrical wiring that is formed asymmetrically with respect to a center of the second pixel in a plane view of the second pixel in the layer closest to the light-receiving portion of the plurality of layers of wirings in the wiring layer in a non-overlapping manner with wirings in layers of the plurality of layers of wirings beneath the layer closest to the light-receiving portion in a cross-sectional view, and
wherein the single symmetrical wiring overlaps wirings in layers of the plurality of layers of wirings provided beneath the single symmetrical wiring except for a wiring in one of the layers of the plurality of layers of wirings provided closest to the single asymmetrical wiring.

2. The solid-state image capture element according to claim 1, wherein a gap of a predetermined distance is provided between the second pixel and the single symmetrical wiring.

3. The solid-state image capture element according to claim 2, wherein the single asymmetrical wiring has a predetermined width from a boundary of the first pixel.

4. The solid-state image capture element according to claim 2,
wherein in the first pixel, the predetermined distance provided between the second pixel and the single symmetrical wiring is corrected in accordance with an arrangement position of the first pixel.

5. The solid-state image capture element according to claim 3, wherein the predetermined width of the single asymmetrical wiring is corrected in accordance with an arrangement position of the second pixel.

6. The solid-state image capture element according to claim 1, wherein the first pixel is a pixel configured to receive red light, and the second pixel is a pixel configured to receive green light.

7. The solid-state image capture element according to claim 1, wherein the first pixel is a pixel configured to receive light having a wavelength of 620 nm or more.

8. The solid-state image capture element according to claim 1, wherein the single asymmetrical wiring shields light reflected from wirings in layers beneath the layer closest to the light-receiving portion of the plurality of layers of wirings in the wiring layer of the first pixel.

9. The solid-state image capture element according to claim 8, wherein the single asymmetrical wiring prevents the reflected light from entering the light-receiving portion of the second pixel from a side opposite the rear-surface side of the semiconductor substrate.

10. The solid-state image capture element according to claim 1, wherein the single symmetrical wiring has a circular or octagonal shape.

11. An electronic device, comprising:
a solid-state image capture element including:
first and second pixels each including a light-receiving portion that receives light incident from a rear-surface side of a semiconductor substrate; and
a wiring layer laminated on a front-surface of the semiconductor substrate,
wherein the first pixel is adjacent to the second pixel,
wherein the first pixel includes a single symmetrical wiring that is formed symmetrically with respect to a center of the first pixel in a plane view of the first pixel in a layer closest to the light-receiving portion of a plurality of layers of wirings in the wiring layer,
wherein the second pixel includes a single asymmetrical wiring that is formed asymmetrically with respect to a center of the second pixel in a plane view of the second pixel in the layer closest to the light-receiving portion of the plurality of layers of wirings in the wiring layer in a non-overlapping manner with wirings in layers of the plurality of layers of wirings beneath the layer closest to the light-receiving portion in a cross-sectional view, and
wherein the single symmetrical wiring overlaps wirings in layers of the plurality of layers of wirings provided beneath the single symmetrical wiring except for a wiring in one of the layers of the plurality of layers of wirings provided closest to the single asymmetrical wiring.

12. The electronic device according to claim 11, wherein a gap of a predetermined distance is provided between the second pixel and the single symmetrical wiring.

13. The electronic device according to claim 12, wherein the single asymmetrical wiring has a predetermined width from a boundary of the first pixel.

14. The electronic device according to claim 12, wherein in the first pixel, the predetermined distance provided between the second pixel and the single symmetrical wiring is corrected in accordance with an arrangement position of the first pixel.

15. The electronic device according to claim 13, wherein the predetermined width of the single asymmetrical wiring is corrected in accordance with an arrangement position of the second pixel.

16. The electronic device according to claim 11, wherein the first pixel is a pixel configured to receive red light, and the second pixel is a pixel configured to receive green light.

17. The electronic device according to claim 11, wherein the first pixel is a pixel configured to receive light having a wavelength of 620 nm or more.

18. The electronic device according to claim 11, wherein the single asymmetrical wiring shields light reflected from wirings in layers beneath the layer closest to the light-receiving portion of the plurality of layers of wirings in the wiring layer of the first pixel.

19. The electronic device according to claim 18, wherein the single asymmetrical wiring prevents the reflected light from entering the light-receiving portion of the second pixel from a side opposite the rear-surface side of the semiconductor substrate.

20. The electronic device according to claim 11, wherein the single symmetrical wiring has a circular or octagonal shape.

* * * * *